(12) United States Patent
Bettman et al.

(10) Patent No.: US 7,173,837 B1
(45) Date of Patent: Feb. 6, 2007

(54) CONTENT ADDRESSABLE MEMORY (CAM) CELL BIT LINE ARCHITECTURE

(75) Inventors: Roger Bettman, Los Altos, CA (US); Eric H. Voelkel, Ben Lomond, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 10/931,960

(22) Filed: Aug. 31, 2004

Related U.S. Application Data

(60) Provisional application No. 60/506,679, filed on Sep. 26, 2003.

(51) Int. Cl.
*G11C 15/00* (2006.01)
*G11C 11/00* (2006.01)
*G11C 8/00* (2006.01)
*G06F 13/00* (2006.01)

(52) U.S. Cl. ............... 365/49; 365/154; 365/230.05; 711/108; 711/117; 711/118; 711/128

(58) Field of Classification Search .............. 365/49, 365/154, 230.05; 711/108, 117, 118, 128, 711/107
See application file for complete search history.

(56) References Cited

U.S. PATENT DOCUMENTS

| | | | |
|---|---|---|---|
| 6,081,440 A | 6/2000 | Washburn et al. | |
| 6,108,227 A | 8/2000 | Voelkel | |
| 6,141,287 A * | 10/2000 | Mattausch | 365/230.03 |
| 6,157,558 A | 12/2000 | Wong | |
| 6,240,000 B1 | 5/2001 | Sywyk et al. | |
| 6,253,280 B1 | 6/2001 | Voelkel | |
| 6,256,216 B1 | 7/2001 | Lien et al. | |
| 6,262,907 B1 | 7/2001 | Lien et al. | |
| 6,266,262 B1 | 7/2001 | Washburn et al. | |
| 6,266,263 B1 * | 7/2001 | Lien et al. | 365/49 |
| 6,331,961 B1 | 12/2001 | Kengeri et al. | |
| 6,400,593 B1 | 6/2002 | Lien et al. | |
| 6,420,990 B1 | 7/2002 | Voelkel | |
| 6,480,406 B1 | 11/2002 | Jin et al. | |
| 6,483,733 B2 | 11/2002 | Lines et al. | |
| 6,502,163 B1 | 12/2002 | Ramankutty | |
| 6,504,740 B1 | 1/2003 | Voelkel | |

(Continued)

OTHER PUBLICATIONS

U.S. Appl. No. 10/873,608, Meng et al.

(Continued)

*Primary Examiner*—Amir Zarabian
*Assistant Examiner*—Ly Duy Pham
(74) *Attorney, Agent, or Firm*—Bradley T. Sako

(57) ABSTRACT

A ternary content addressable memory (TCAM) cell (100) can include two memory elements (102-0 and 102-1) with a single bit line (106-0 and 106-1) per memory element. A TCAM cell (100) can also include a compare stack (104) and two word lines (114 and 116) that can connect to each memory element (102-0 and 102-1). The memory elements (102-0 and 102-1) can include SRAM type memory cells with one of two data terminals connected to a pre-write potential (Vpre, which can be a ground potential, or the like). Write operations can include pre-setting the data values of memory elements (102-0 and 102-1) to the pre-write potential prior to providing write data via the bit lines (106-0 and 106-1).

17 Claims, 6 Drawing Sheets

U.S. PATENT DOCUMENTS

| | | | |
|---|---|---|---|
| 6,505,270 B1 | 1/2003 | Voelkel et al. | |
| 6,515,884 B1 | 2/2003 | Sywyk et al. | |
| 6,647,457 B1 | 11/2003 | Sywyk et al. | |
| 6,661,716 B1 | 12/2003 | Sywyk et al. | |
| 6,697,275 B1 | 2/2004 | Sywyk et al. | |
| 6,721,202 B1 | 4/2004 | Roge et al. | |
| 6,751,755 B1 | 6/2004 | Sywyk et al. | |
| 6,763,426 B1 | 7/2004 | James et al. | |
| 6,772,279 B1 | 8/2004 | Sun et al. | |
| 6,804,744 B1 | 10/2004 | Abbas | |
| 6,828,689 B2 * | 12/2004 | Madurawe | 257/213 |
| 6,845,024 B1 | 1/2005 | Wanzakhade et al. | |
| 6,876,558 B1 | 4/2005 | James et al. | |
| 6,892,273 B1 | 5/2005 | James et al. | |
| 6,903,951 B1 | 6/2005 | James | |
| 6,906,936 B1 | 6/2005 | James | |
| 6,954,823 B1 | 10/2005 | James | |
| 6,958,925 B1 | 10/2005 | Om et al. | |
| 2003/0012063 A1 * | 1/2003 | Chien | 365/200 |

OTHER PUBLICATIONS

U.S. Appl. No. 10/180,357, Chou.
U.S. Appl. No. 10/197,298, Sun et al.
U.S. Appl. No. 10/202,528, Zou.
U.S. Appl. No. 10/209,142, James et al.
U.S. Appl. No. 10/217,746, Chou.
U.S. Appl. No. 10/264,667, James.
U.S. Appl. No. 10/266,953, Wanzakhade.
U.S. Appl. No. 10/271,660, James.
U.S. Appl. No. 10/281;814, James.
U.S. Appl. No. 10/320,053, Wanzakhade.
U.S. Appl. No. 10/320,588, Wanzakhade.
U.S. Appl. No. 10/329,146, James et al.
U.S. Appl. No. 10/897,062, Venkatachary.
U.S. Appl. No. 10/930,138, Meng.
U.S. Appl. No. 10/931,960, Bettman et al.
U.S. Appl. No. 10/940,129, Narum.
U.S. Appl. No. 10/948,050, Vankatachary et al.
U.S. Appl. No. 10/950,323, Birman et al.
U.S. Appl. No. 10/977,516, Om.
U.S. Appl. No. 11/000,568, Smith.
U.S. Appl. No. 11/011,464, Smith.
U.S. Appl. No. 11/014,123, Om et al.
U.S. Appl. No. 11/043,391, Gupta.
U.S. Appl. No. 11/047,793, Gupta et al.
U.S. Appl. No. 11/085,399, Om.
U.S. Appl. No. 11/089,837, Smith.
U.S. Appl. No. 11/090,116, Banachowicz et al.
U.S. Appl. No. 11/148,639, Maheshwari.
U.S. Appl. No. 11/207,323, Vankatachary.
U.S. Appl. No. 11/219,109, Maheshwari.
U.S. Appl. No. 60/629,694, Jiang.
U.S. Appl. No. 60/657,754, Maheshwari.
U.S. Appl. No. 60/661,745, Maheshwari.
U.S. Appl. No. 60/663;656, Maheshwari.
U.S. Appl. No. 60/668,875, Maheshwari.
U.S. Appl. No. 60/667,325, Om.

* cited by examiner

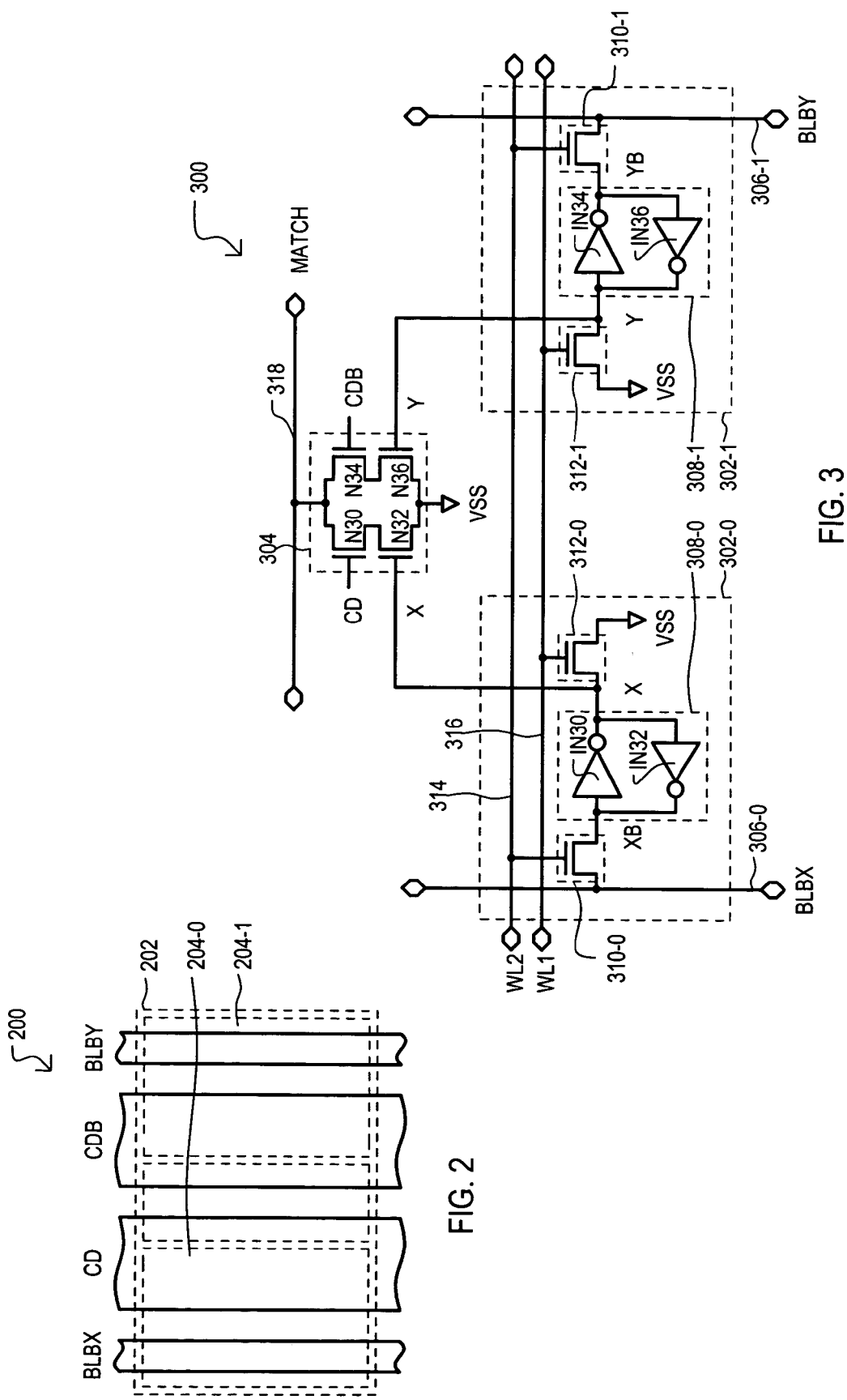

CONTENT ADDRESSABLE MEMORY (CAM) CELL BIT LINE ARCHITECTURE

This application claims the benefit of U.S. Provisional Patent Application Ser. No. 60/506,679 filed on Sep. 26, 2003.

TECHNICAL FIELD

The present invention relates generally to integrated circuits, and more particularly to content addressable memory (CAM) circuits having ternary CAM cells.

BACKGROUND OF THE INVENTION

Content addressable memory (CAM) device enjoy wide use in a variety of applications, including high speed switches and routers for communications. CAM devices can include both binary CAMs and ternary CAMs. Binary CAM devices can include bit locations for accommodating two stored states for comparison: "0" or "1". Ternary CAM (TCAM) devices can include bit locations for accommodating three states for comparison: "0", "1", or "X" (where X is a don't care term, that provides a match regardless of the compare data value).

One example of a CAM device that can reduce current consumption is shown in U.S. Pat. No. 6,515,884, titled CONTENT ADDRESSABLE MEMORY HAVING REDUCED CURRENT CONSUMPTION, issued to Stefan P. Sywyk et al., on Feb. 4, 2003 (Sywyk et al.). Sywyk et al. shows a various particular examples of a CAM device that can include a "pseudo-VSS" arrangement that can conserve power by regulating match line discharge paths.

Another example of a conventional TCAM device is set forth in FIG. 7, and designated by the general reference character 700. A conventional TCAM approach 700 shows one TCAM memory element (cell) which includes two standard six transistor (6-T) type static random access memory (SRAM) cells 702-0 and 702-1 and an exclusive OR (XOR) type compare stack 704.

The 6-T SRAM cells (702-0 and 702-1) can serve as memory elements that establish a comparison state. As shown in FIG. 7, each 6-T SRAM cell (702-0 and 702-1) receives a corresponding bit line pair (706-0 and 706-1), each including one bit line (BL) and one bit line bar (BLB) or "complement".

The bit line pairs (706-0 and 706-1) per memory element are used for both read and write operations to each SRAM cell (702-0 and 702-1).

An XOR type comparison stack 704 can generate a compare result for the conventional TCAM cell 700. In particular, data values (shown as X and Y) stored in SRAM cells (702-0 and 702-1) can be compared against complementary compare data values (CD and CDB) provided by differential compare data lines (not shown). In the particular arrangement of FIG. 7, in the event of a match compare result, a match line 708 can remain essentially isolated from a low power supply voltage VSS. In the event of a mismatch compare result, an XOR type comparison stack 704 can provide a discharge path to a low power supply voltage VSS.

FIG. 8 represents a layout arrangement of a TCAM cell 800, like that shown in FIG. 7. As shown in FIG. 8, use of bit lines (BL) and bit line bars (BLB) can require two metal resources per SRAM cell 804-0 and 804-1. These metal lines run in the same direction as the compare data lines CD and CDB. As a result, a pitch for compare data lines (CD and CDB) is limited in order to accommodate bit line pairs in the same direction.

An alternate conventional approach can include a single word line for accessing memory elements via bit lines. However, such a conventional approach applies one voltage in a read operation, and another higher voltage in a write operation, in order to maintain read stability and write margins.

A drawback of the above alternate conventional approach can be increased design risk and complexity resulting from the application of different word line voltages for read and write operations.

In light of the above, it would be desirable to arrive at some way of providing a TCAM cell with two data storage cells that can have less design risk than multiple voltage approaches.

In addition, it would also be desirable to arrive at some way of providing a TCAM cell with two data storage cells that provides greater flexibility in the placement and/or pitch of compare data lines.

SUMMARY OF THE INVENTION

The present invention can include a content addressable memory (CAM) cell having at least two memory elements configured to provide first and second data values to a compare stack. The compare stack can provide a compare indication between a compare data value and the first and second data values. Each memory element can include a first controllable impedance path coupled to a first bit line that is controlled in response to a first word line, and a second controllable impedance path coupled to a predetermined logic level that is controlled in response to a second word line different from the first word line.

In such an arrangement, second controllable impedance paths can allow the memory elements to be pre-set to certain logic values prior to a write. Such an arrangement, can allow for more stable writing of data values into the CAM cell.

According to one aspect of the embodiments, a CAM cell can further include a compare stack with parallel discharge paths between a match line and a predetermined voltage. At least one of the discharge paths can be enabled for a first bit compare miss result, and both discharge paths being disabled for a second bit compare miss result.

According to another aspect of the embodiments, the compare stack comprises a first discharge path having two transistors coupled in series. One discharge path can receive a compare data value and the first data value. The other discharge path can receive a complementary compare data value and the second data value.

According to another aspect of the embodiments, a predetermined voltage can be any of a low power supply voltage and/or ground.

According to another aspect of the embodiments, a compare stack can provide a compare indication in a compare operation. In addition, the predetermined voltage to which a compare stack is connected can be a pseudo-supply voltage. The pseudo-supply voltage can be placed to a set voltage in a pre-compare operation and allowed to float in the compare operation.

Such an arrangement can provide for a CAM cell having one bit line per storage element that can be utilized in a "pseudo-supply" compare (i.e., sensing) arrangement.

According to another aspect of the embodiments, the predetermined logic level by which memory elements can be pre-set can be a pseudo-supply voltage. Even further, the a pseudo-supply voltage can be a pseudo-ground voltage that is discharged in a pre-write operation prior to the application of write data from the bit lines, and allowed to float during a compare operation.

Such an arrangement can provide for a CAM cell having one bit line per storage element that can be utilized with a "pseudo-ground" arrangement, which can have low charge consumption advantages.

According to another aspect of the embodiments, a sense amplifier can sense a differential voltage between input terminals having one input terminal coupled to the match line and another input terminal coupled to the pseudo-supply voltage.

According to another aspect of the embodiments, a predetermined logic level can be selected from the group consisting of a low power supply voltage and ground.

According to another aspect of the embodiments, a compare stack can provide a compare indication in a compare operation. In addition, a predetermined logic level for storage elements can be a pseudo-supply voltage that is placed to a set voltage in a pre-compare operation, and allowed to float in the compare operation.

According to another aspect of the embodiments, a compare stack can provide an exclusive OR type function between the compare data value and the first and second data values.

According to another aspect of the embodiments, each memory element can be a static random access memory storage structure. Alternatively, each memory element can be a dynamic random access memory storage structure.

In this way, storage elements of a CAM cell should necessarily be limited to a particular storage circuit type.

The present invention can also include a static random access memory (SRAM) type storage element for storing a data value. Such a storage element can include no more than one bit line, a pre-write transistor having a current path coupled to a power supply terminal and a control terminal coupled to a first word line, and an access transistor having a current path coupled to the one bit line and a control terminal coupled to a second word line different from the first word line.

In this way, an SRAM cell can be pre-set to a particular data value prior to the writing of data into the cell. This can provide for more stable write operations.

According to one aspect of the embodiments, a power supply terminal can be coupled to an essentially constant power supply voltage selected from a low power supply voltage and ground.

According to another aspect of the embodiments, the storage element is part of a ternary content addressable memory cell. Further, the power supply terminal can be coupled to a pseudo-supply voltage placed to one voltage prior to the application of write data on the one bit line, and allowed to float during a compare operation between the data stored in the storage element and a compare data value.

According to another aspect of the embodiments, the storage element can also include exclusive-OR type comparator having one input coupled between the pre-write transistor and the access transistor and at least one other input coupled to receive a compare data value.

The present invention can also include a ternary content addressable memory (CAM) arrangement. The CAM arrangement can include a plurality of CAM cells, where each such CAM cell includes at least two latches for storing data for comparison with a compare data value. Further, each latch can be coupled to no more than one bit line, and can include an access device for coupling each bit line to the corresponding latch according to a potential of a first word line, and a pre-write device for coupling the corresponding latch to a predetermined voltage according to a potential of a second word line.

According to one aspect of the embodiments, the latches can include a first latch coupled to a first bit line and a second latch coupled to a second bit line. The first and second bit lines can be formed from a conductive layer and disposed parallel to one another. In addition, a compare data value can include complementary data values provided by complementary compare data lines formed from the conductive layer. The complementary compare data lines can be parallel to and between the first and second bit lines.

In this way, reductions in the number of bit lines, can allow for greater pitch in those lines routed in the same direction as the bit lines, such as compare data lines.

According to another aspect of the embodiments, compare data lines can be wider than the bit lines.

Such an arrangement can allow for faster compare operations, as wider compare data lines can provide a lower resistance.

BRIEF DESCRIPTION OF THE DRAWINGS

FIG. 2 is a figure showing a plan view of the TCAM cell of FIG. 1.

FIG. 3 is a block diagram showing a TCAM cell according to a second embodiment of the present invention.

DETAILED DESCRIPTION

According to embodiments of the present invention, storage elements, for use in ternary content addressable memory (CAM) devices can be coupled to single bit line, thus allowing more room for other routed signals, such as compare data values provided by complementary compare data lines.

Figure 1:
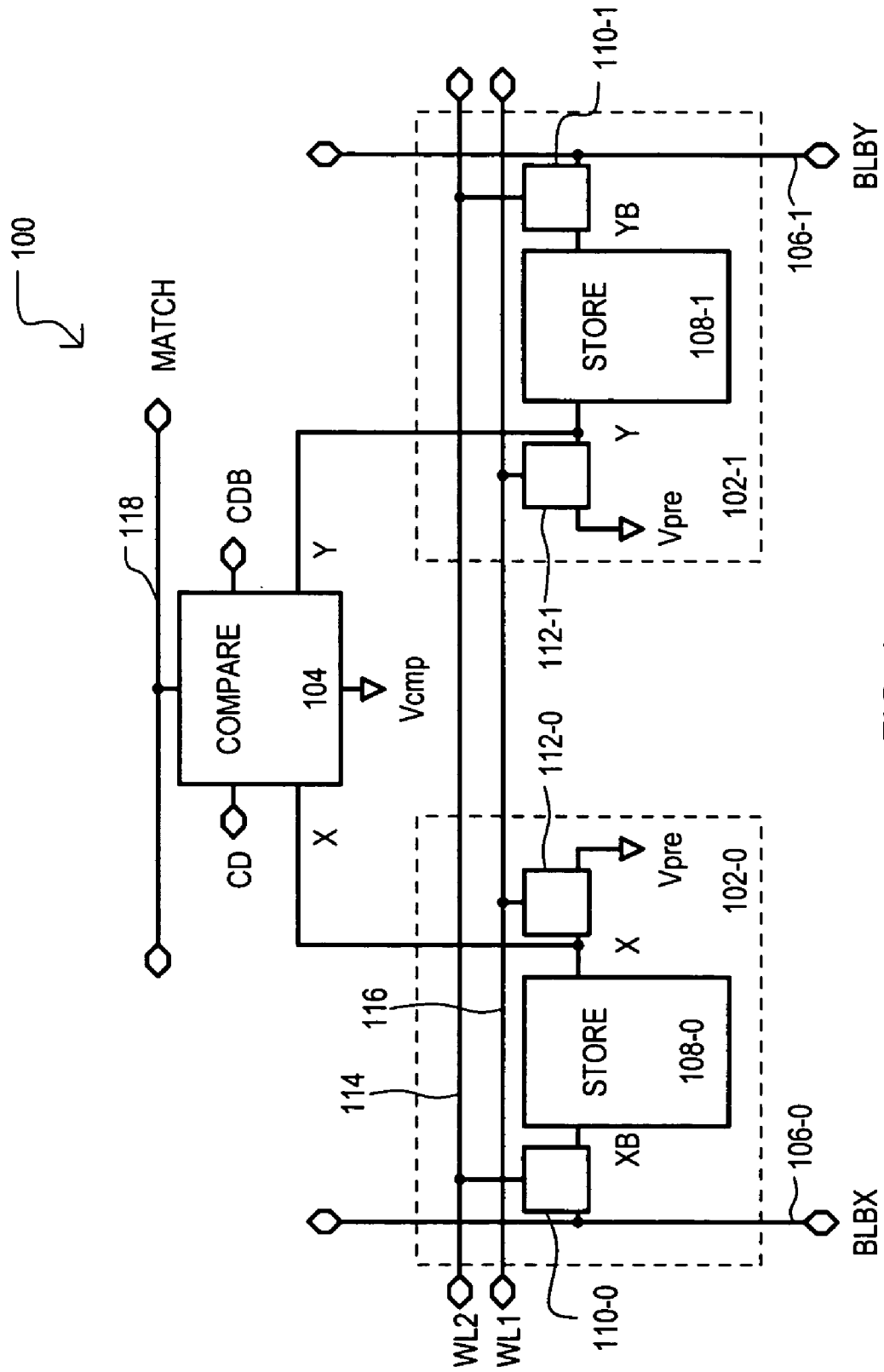
FIG. 1 is a block diagram showing a ternary content addressable memory (TCAM) cell according to one embodiment of the present invention.
Figure 7:
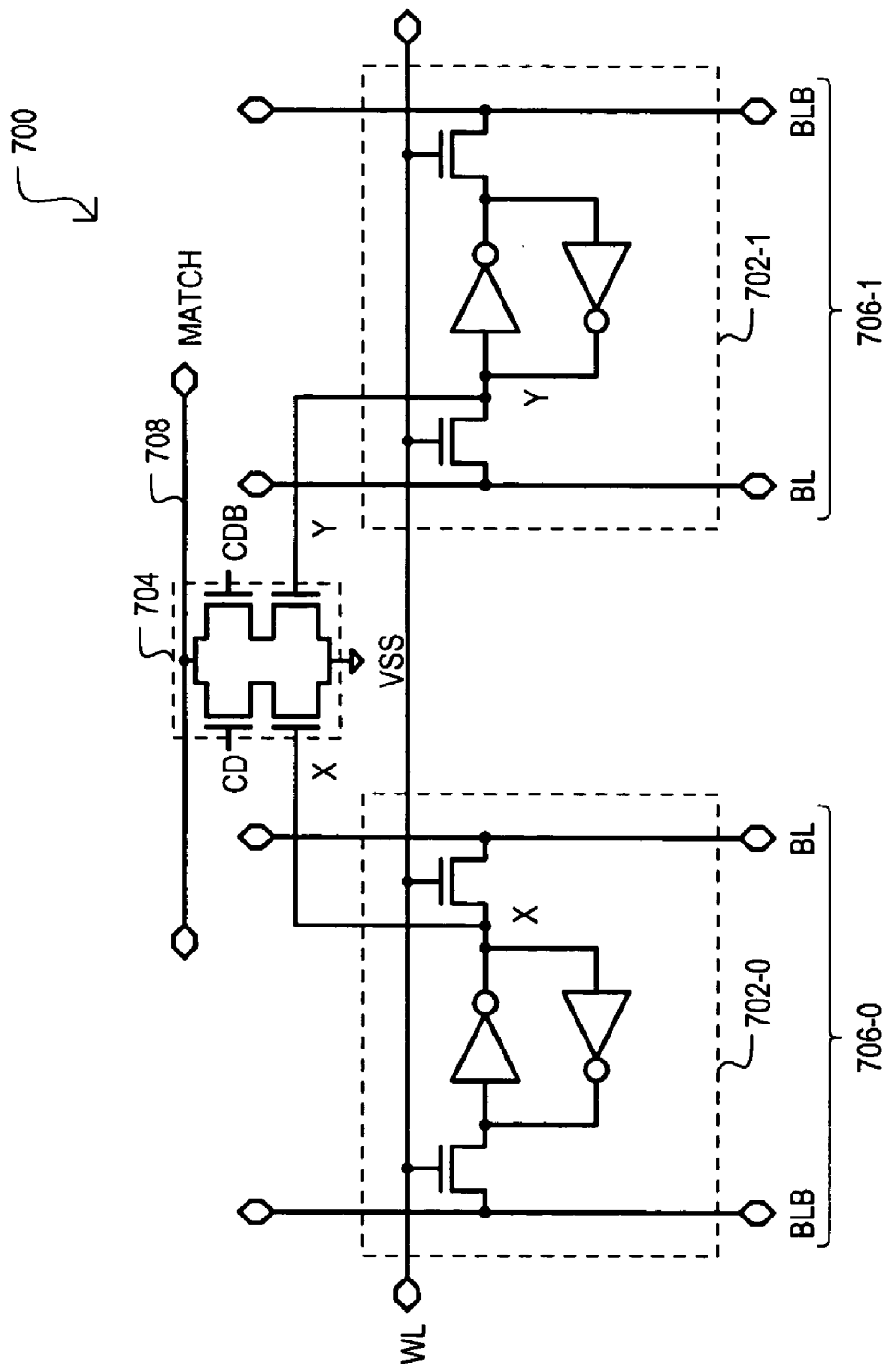
FIG. 7 is a block schematic diagram of a conventional TCAM cell.

A ternary CAM cell according to a first embodiment is set forth in FIG. 1, and designated by the general reference character 100. A CAM cell 100 can include two memory elements 102-0 and 102-1 and a compare section 104. Unlike the conventional arrangement of FIG. 7, each memory element (102-0 and 102-1) can be connected to only one bit line 106-0 and 106-1.

Each memory element (102-0 and 102-1) can include a storage section (108-0 and 108-1), an access device (110-0 and 110-1) and pre-write device (112-1 and 112-0). A storage section (108-0 or 108-1) can provide a data value (X or Y) that can be compared to a compare data value in compare section 104. In the particular example of FIG. 1, a storage section (108-0 or 108-1) can include two data terminals, one coupled to the corresponding access device the other coupled to the corresponding pre-write device.

Storage sections (108-0 or 108-1) can be based on various memory technologies, including but not limited to dynamic random access memory (DRAM), static RAM (SRAM) or non-volatile memory, or some combination thereof. Preferably, storage sections (108-0 or 108-1) are based on SRAM technology.

In a similar fashion as a conventional approach, an access device (110-0 or 110-1) can connect a single bit line (106-0 and 106-1) to a data terminal of the corresponding storage section (108-0 and 108-1). Further, the access devices (110-0 and 110-1) can be commonly controlled by a word line WL2 114. That is, according to word line WL2 114, access devices (110-0 and 110-1) can provide a low impedance path or high impedance path between the respective bit line and corresponding storage section.

Unlike the conventional case, within each memory element (102-0 and 102-1) pre-write devices (112-0 and 112-1) can selectively connect a terminal of each storage section (108-0 and 108-1) to a predetermined pre-write potential Vpre. Pre-write devices (112-0 and 112-1) can be commonly controlled by a word line WL1 116. Thus, according to word line WL1 116, access devices (110-0 and 110-1) can provide a low impedance or high impedance path between the respective storage section and a pre-write potential Vpre.

A pre-write potential Vpre can establish predetermined logic values in storage sections (108-0 and 108-1) by operation of corresponding pre-write devices (112-0 and 112-1). As will be described in other embodiments, a pre-write potential Vpre can be essentially static, or may be voltage that can vary according to the operation being performed by the CAM cell 100.

A compare section 104 can receive data values (X and Y) from the storage sections (108-0 and 108-1) as well as a compare data value. In the very particular example of FIG. 1, a compare data value is provided as two complementary values CD and CDB. A compare section 104 can provide a compare result between the compare data value (CD and CDB) and received data values (X and Y). Such compare results can include a match, or a mis-match. A match result can indicate a compare data value (CD and CDB) matches a particular logic value represented by data values X and Y, or the X and Y values store a "don't care" state (e.g., the bit is masked). A mis-match result can indicate that the data value (CD and CDB) does not match a particular logic value represented by data values X and Y.

In the very particular example of FIG. 1, a compare section 104 is situated between a match line 118 and a predetermined compare potential Vcmp. In the event of match compare result, a compare section 104 can provide a high impedance path between match line 118 and compare potential Vcmp. Conversely, in the event of mis-match compare result, a compare section 104 can provide a low impedance path between match line 118 and compare potential Vcmp.

As will be described in other embodiments, a compare potential Vcmp can be essentially static, or may be voltage that can vary according to the operation being performed by the CAM cell 100. Further, a compare voltage Vcmp can be essentially the same as a pre-write potential Vpre.

Having described the general arrangement of a first embodiment, the operation of the first embodiment will now be described.

In a write operation, data can be written into storage sections (102-0 and 102-1) according to a two-step process involving a pre-write step and a write data step. In a pre-write step, word line WL1 116 can enable pre-write devices 112-0 and 112-1 while word line WL2 114 disables access devices (110-0 and 110-1). Such an operation can result in storage sections (108-0 and 108-1) being set to predetermined logic values. That is, CAM cell 100 (and all other CAM cells connected to word line WL1 116) is now in a known logic state.

In a write data step, word line WL1 116 can disable pre-write devices (112-0 and 112-1) while word line WL2 114 enables access devices (110-0 and 110-1). Further, bit lines (106-0 and 106-1) can be driven with desired write data. Such an operation can result in storage sections (108-0 and 108-1) being set to a desired data value determined by write data on bit lines (106-0 and 106-1).

Figure 8:
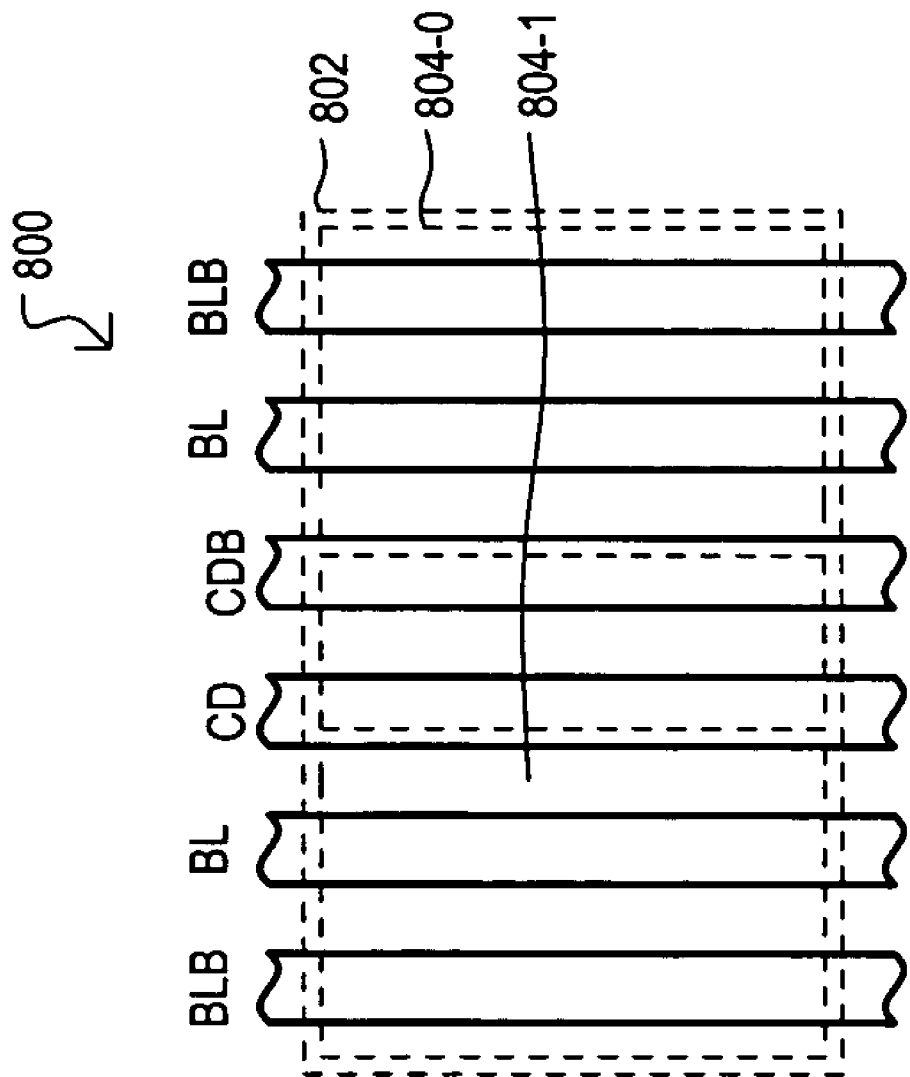
FIG. 8 is a top plan view of a conventional TCAM cell.

Referring now to FIG. 2, a layout arrangement of a CAM cell 200, like that shown in FIG. 1, is shown in a top plan view. As noted above, a CAM cell 202 can include but one bit line per storage section. Thus, unlike the conventional case of FIG. 8, one bit line (BLBX or BLBY) is utilized per storage section 204-0 and 204-1. These metal lines can run in the same direction as the compare data lines (CD and CDB). As a result, a pitch for compare data lines (CD and CDB) can be greater than the above conventional case. Preferably, bit lines (BLBX and BLBY) and compare data lines (CD and CDB) are formed from a same conductive layer.

A layout arrangement like that of FIG. 2, can provide for easier routing of signals, or can enable any of bit lines (BLBX or BLBY) or compare data lines (CD or CDB) to be made larger, or can allow other signals to be routed in the same direction and with the same conductive layer.

In the particular example of FIG. 2, an increase in routing area (pitch) has enabled larger (wider) compare data lines. This can result in lower resistance compare data lines, which can increase a compare speed operation. Compare speed is typically one of the most important aspects of a CAM device.

Referring now to FIG. 3, a CAM cell according to another embodiment is set forth in a schematic diagram and designated by the general reference character 300. A CAM cell 300 can include the same general components as that of FIG. 1. Thus, like components are referred to by the same reference character but with the first digit being a "3" instead of a "1".

In the particular example of FIG. 3, storage sections 308-0 and 308-1 can each include cross-coupled inverters IN30/IN32 and IN34/IN36. As would be understood by one skilled in the art, such inverters can be formed by two complementary transistors in a CMOS implementation. Thus, storage sections (308-0 and 308-1) can be considered latches. Access devices 310-0 and 310-1 are n-channel insulated gate field effect transistors (e.g., MOSFETs) having a source-drain path connected between one data terminal of the respective storage section (308-0 and 308-1) and the corresponding single bit line (306-0 and 306-1).

Advantageously, pre-write devices (312-0 and 312-1) are also n-channel MOSFETs having a source drain path connected between another data terminal of the respective storage section (308-0 and 308-1) and a low power supply voltage VSS.

A low power supply voltage VSS can be an essentially constant voltage. For example, such a voltage can be an externally supplied low power supply voltage (e.g., ground), or a low power supply voltage of a CAM array containing a CAM cell 300. Such a value can remain at essentially the same level for write and compare operations. However, such a voltage could change in standby modes, or the like.

It is understood from FIG. 3 that each storage section (302-0 and 302-1) can have the same circuit components as a six-transistor (6-T) SRAM cell, but with a different connection (sources of n-channel devices 312-0 and 312-1 being connected to voltage VSS instead of another bit line). Thus, a CAM cell 300 can be easily implemented utilizing existing CAM and/or SRAM layouts, yet result in fewer bit lines.

A compare section 304 of CAM cell 300 can provide an exclusive-OR type function. In the example of FIG. 1, the exclusive-OR function can operate as shown below in Table 1.

TABLE 1

| X | Y | COMPARE |
|---|---|---------|
| 0 | 0 | Don't Care |
| 1 | 0 | Match CD = 0 |
| 0 | 1 | Match CD = 1 |
| 1 | 1 | Not used |

The very particular structure of FIG. 3 includes two parallel paths, one formed by source-drain paths of n-channel transistors N30 and N32, and the other formed by source-drain paths of n-channel transistors N34 and N36. N-channel transistor N30 can have a gate that receives a compare data value CD, and n-channel transistor N32 can have a gate that receives a data value X from storage section 302-0. Along the other path, n-channel transistor N34 can have a gate that receives a complementary compare data value CDB, and n-channel transistor N36 can have a gate that receives a data value Y from storage section 302-1. Drains of transistors N30 and N34 can be commonly connected to match line 318. Sources of transistors N32 and N36 can be commonly connected to a low power supply voltage VSS.

In the particular arrangement of FIG. 3, in a match result, the two paths within compare section 304 can provide high impedance paths. In a miss result, one path within compare section can have a low impedance.

Of course, the compare section 304 represents one arrangement of the embodiment. Other possible arrangements can be used to perform similar or other logic functions.

As noted previously, a low power supply voltage VSS can be essentially constant in a write and compare operation.

The example of FIG. 3 thus shows an arrangement in which an SRAM type memory element is used (memory elements 302-0 and 302-1) and each bit line (BLBX and BLBY) can connect to one data terminal.

As noted above, the other data terminal of each memory element (302-0 and 302-1) can be connected to a lower power supply VSS by operation of pre-write devices (312-0 and 312-1). Thus, such a connection can be considered a "hard" or direct ground. Further, this ground connection can be done within the memory element (e.g., SRAM type cell) itself and without routing an additional line out of the element.

Figure 4:
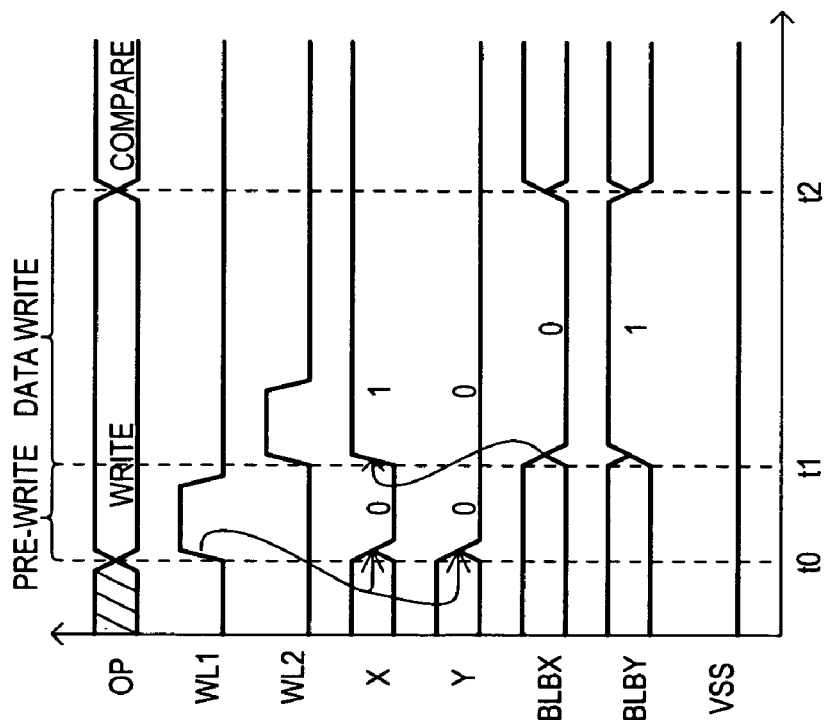
FIG. 4 is a timing diagram showing the operation of the TCAM cell of FIG. 3.

The operation of the embodiment of FIG. 3 will now be described with reference to FIG. 4. FIG. 4 is a timing diagram that shows a waveform OP that represents an operation being performed by a CAM device containing memory cell 300. Word line potentials are shown by WL1 and WL2, and data values for storage elements 302-0 and 302-1 are shown as X and Y. FIG. 4 also shows values for bit lines BLBX and BLBY. Finally, a low power supply voltage VSS is also shown.

Referring now to FIG. 3 in conjunction with FIG. 4, at about time t0, write operations within CAM cell 300 can begin. Writing of the storage elements (302-0 and 302-1) can be accomplished as a two-phase operation with the first phase including a "preset write" technique. A preset write begins at about time t0, and includes pulsing a word line WL1 high while the other word line WL2 remains low. This can enable pre-write transistors 310-0 and 310-1, which can connect respective data terminals to a low power supply VSS. Thus, in response to word line WL1 pulsing high data values X and Y can both go low. This essentially sets the value of both the X and Y elements to be "0".

A first word line WL1 can then return low.

A second phase of the write operation can begin at about time t1. Once word line WL1 has returned low, the other word line (WL2) can go high. At the same essential time, bit lines BLBX and BLBY can carry write data values to establish a predetermined state. In the particular example shown, the write operation seeks to establish the state "Match CD=0". Thus, bit line BLBX can be low (logic "0"), while bit line BLBY can be high (logic "1"). As a result, data values of X=1 and Y=0 are written into storage elements 302-0 and 302-1, respectively.

In the very particular example of FIG. 4, a write operation can be followed by a search (or compare) operation at time t2. As shown in FIG. 4, a low power supply voltage VSS can remain essentially the same throughout both such operations.

A third embodiment will now be described with reference to FIG. 5. A third embodiment can include a CAM cell 500 having the same components as that of FIG. 3. Thus, like components are referred to by the same reference character but with the first digit being a "5" instead of a "3".

A CAM cell 500 can differ from the embodiment of FIG. 3 in that pre-write devices 512-0 and 512-1 can provide controllable impedance paths between a "pseudo-supply" voltage PVSS and an corresponding storage section (508-0 and 508-1). Further, a compare section 504 can be connected between match line 518 and the same pseudo-supply voltage PVSS.

A pseudo-supply voltage PVSS can be the voltage at a node that is initially set to some predetermined voltage during one operational phase, but then subsequently allowed to float in another operational phase. In the very particular example of FIG. 5, a pseudo-supply voltage PVSS is set to a low power supply voltage (VSS) during certain operational phases (e.g., pre-write, pre-compare) and allowed to float during other phases (e.g., compare).

In the very particular example shown, during a pre-write operation, PVSS can be pulled to a ground level. Additionally, during a match operation, a match sense amplifier (not shown) may use the PVSS line (either in addition to or instead of the MATCH line) to detect the results of the compare operation.

Figure 6:
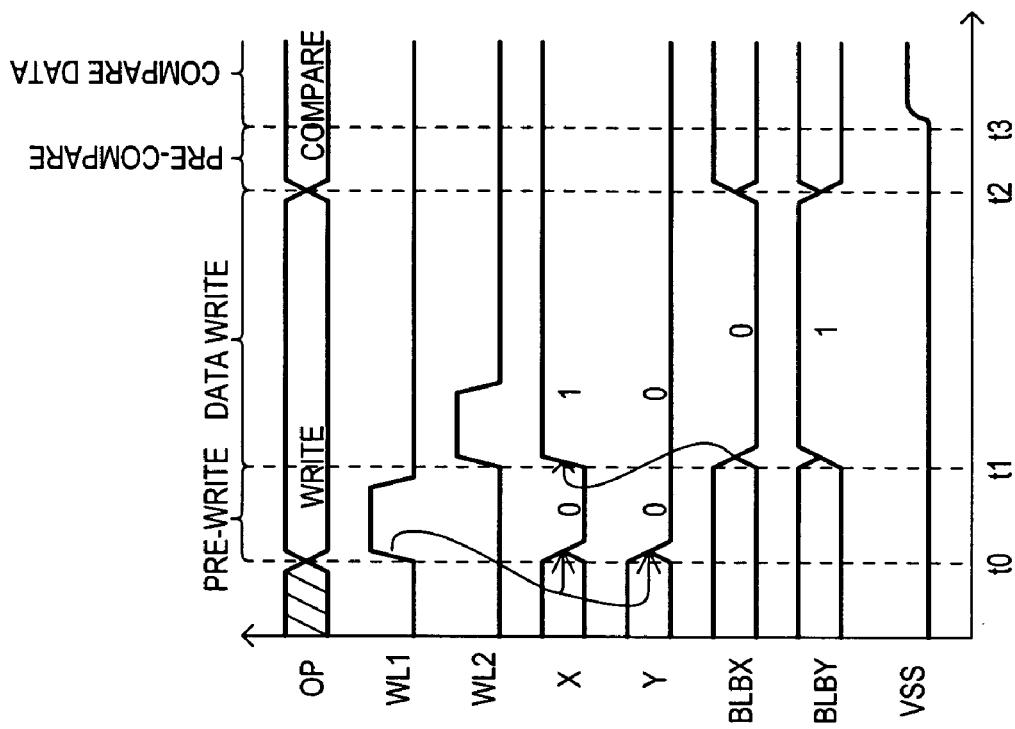
FIG. 6 is a timing diagram showing the operation of the TCAM cell of FIG. 5.
Figure 5:
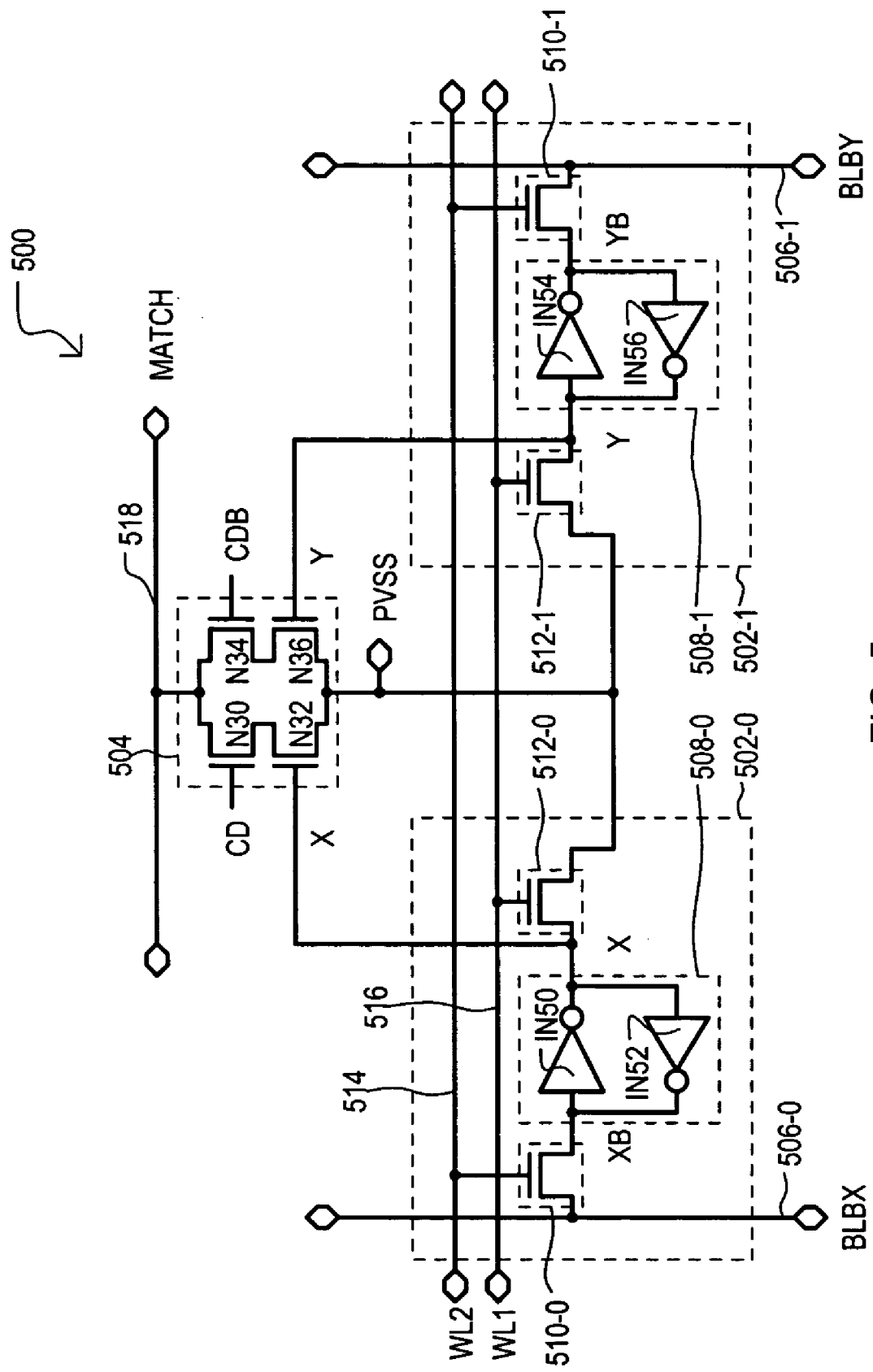
FIG. 5 is a block diagram showing a TCAM cell according to a third embodiment of the present invention.

The operation of the embodiment of FIG. 5 is shown in more detail in FIG. 6. FIG. 6 is a timing diagram showing the same general waveforms and write operation as FIG. 4, except that a VSS waveform is replaced by a PVSS waveform that represents a "pseudo-supply" voltage.

As shown in FIG. 6 a pseudo-supply voltage PVSS can be set to ground during a pre-write operation, thus provide a potential for presetting storage sections to predetermined values. Thus, a pre-write operation can be essentially the same as the embodiment of FIG. 4.

At time t2 in FIG. 6, in a pre-compare portion of a compare operation, a pseudo-supply voltage PVSS can be pre-set to a ground potential. However at time t3, (assuming a mis-match compare result) a pseudo-supply voltage PVSS node can be allowed to float, and thus will rise due to the charge present on one or more match lines.

One example of a sense amplifier that can be used in a CAM device with a pseudo-supply voltage is shown in U.S.

patent application Ser. No. 10/873,608, filed Jun. 22, 2004, titled SENSE AMPLIFIER CIRCUIT FOR CONTENT ADDRESSABLE MEMORY DEVICE by Anita X Meng et al. (hereinafter Meng et al. I). The contents of this application are included herein with this patent application and incorporated by reference.

Another example of sense amplifiers and corresponding circuits that can be used with a pseudo-supply voltage is shown in U.S. patent Ser. No. 10/930,539, filed Aug. 30, 2004, titled SENSE AMPLIFIER ARCHITECTURE FOR CONTENT ADDRESSABLE MEMORY DEVICE also by Anita X. Meng et al. (hereinafter Meng et al. II). The contents of this application are also included herewith and incorporated by reference herein.

As would be understood from the above, a physical arrangement/architecture of a TCAM cell according to the above embodiments can include bit lines and compare data lines oriented in the same direction. A critical speed parameter of a TCAM cell can be a compare operation. The above embodiments can reduce the number of physical wires in the compare data line direction by eliminating a bit line per memory element (eliminating two bit lines per TCAM cell). Consequently, a pitch of compare data lines can be optimized to increase the speed of a compare operation. For example, and as described above, the compare data lines may be widened to reduce the resistance along such a line. Also, by using the "split" or "dual" word line approach, including a preset word line as described above, a more stable memory element can be provided as different word line voltages for write/read operation can be avoided.

It is also understood that other embodiments may include other types of memory elements than those explicitly noted above.

Further, while CAM cell arrangements have been described, alternate embodiments can employ the memory elements shown for use as SRAM-like cells, such as in stand-alone SRAM chips and/or embedded memory chips. Such applications may not be configured as CAM applications specifically, but may include memory cells serving as storage devices generally. Such a use may be particularly applicable where metal and/or signal space is limited in the physical bit line direction.

Still further, while the embodiments have shown memory sections that are pre-set to the same particular logic value (e.g., "0"), alternate embodiments can include presetting such memory sections to different logic values depending upon the particular application of the device and/or compare logic.

Accordingly, while the various aspects of the particular embodiments set forth herein have been described in detail, the present invention could be subject to various changes, substitutions, and alterations without departing from the spirit and scope of the invention.

What is claimed is:

1. A content addressable memory (CAM) cell, comprising:
   at least two memory elements configured to provide first and second data values to a compare stack that provides a compare indication between a compare data value and the first and second data values, the compare stack comprises at least one discharge path coupled between a match line and a predetermined voltage node that is allowed to float in a compare operation, each memory element comprising
   a first controllable impedance path coupled to a first bit line that is controlled in response to a first word line, and
   a second controllable impedance path coupled to a predetermined logic level that is controlled in response to a second word line different from the first word line.

2. The CAM cell of claim 1, further comprising:
   the compare stack comprises parallel discharge paths between the match line and the predetermined voltage node, at least one of the discharge paths being enabled in a first compare result, and both discharge paths being disabled in a second compare result.

3. The CAM cell of claim 1, wherein:
   the compare stack comprises a first discharge path having two transistors coupled in series, one discharge path receiving a compare data value and the first data value, the other discharge path receiving a complementary compare data value and the second data value.

4. The CAM cell of claim 1, wherein:
   the compare stack provides the compare indication in a compare operation; and
   the predetermined voltage node is a pseudo-supply voltage node placed to a set voltage in a pre-compare operation preceding the application of compare data values and allowed to float in the compare operation that compares the compare data value to the stored data values.

5. The CAM cell of claim 4, wherein:
   the set voltage is selected from the group consisting of a low power supply voltage and ground.

6. The CAM cell of claim 4, wherein:
   the predetermined logic level is also the pseudo-supply voltage level, and the pseudo-supply voltage level is a pseudo-ground voltage that is discharged in a pre-write operation that precedes the application of write data from the bit lines to the respective memory elements.

7. The CAM cell of claim 4, further including:
   a sense amplifier that senses a differential voltage between input terminals, the sense amplifier having one input terminal coupled to the match line and another input terminal coupled to the pseudo-supply voltage.

8. The CAM cell of claim 1, wherein:
   the predetermined logic level is selected from the group consisting of a lower power supply voltage and ground.

9. The CAM cell of claim 1, wherein:
   the compare stack provides the compare indication in a compare operation; and
   the predetermined logic level is a pseudo-supply voltage placed to a set voltage in a pre-compare operation preceding the application of compare data values and allowed to float in a compare operation that compares the compare data value to the stored data values.

10. The CAM cell of claim 1, wherein:
    the compare stack provides an exclusive OR type function between the compare data value and the first and second data values.

11. The CAM cell of claim 1, wherein:
    each memory element comprises a static random access memory storage structure.

12. The CAM cell of 1, wherein:
    each memory element comprises a dynamic random access memory storage structure.

13. A content addressable memory cell comprising:
    at least one static random access memory (SRAM) type storage element for storing a data value, the storage element comprising
    no more than one bit line;
    a pre-write transistor having a current path coupled to a power supply terminal and a control terminal coupled to a first word line, the power supply terminal being allowed to float during a compare operation between the data stored in the storage element and a compare data value; and an access transistor having a current path coupled to the one bit line and a control terminal coupled to a second word like different from the first word line.

14. The storage element of claim 13, wherein:

the power supply terminal is coupled to an essentially constant power supply voltage selected from the group consisting of a low power supply voltage and ground.

15. The storage element of claim 13, wherein:

the power supply terminal is coupled to a pseudo-supply voltage placed to one voltage prior to the application of write data on the one bit line, and allowed to float during the compare operation.

16. The storage element of claim 15, wherein:

the cone voltage is a low power supply voltage.

17. The storage element of claim 13; further including:

an exclusive-OR type comparator having one input coupled between the pre-write transistor and the access transistor and at least one other input coupled to receive a compare data value.

* * * * *